(12) United States Patent
Albertini et al.

(10) Patent No.: US 10,339,914 B2
(45) Date of Patent: *Jul. 2, 2019

(54) TRANSMIT/RECEIVE CHANNEL FOR ULTRASOUND APPLICATIONS

(71) Applicant: STMicroelectronics S.r.l., Agrate Brianza (IT)

(72) Inventors: Matteo Albertini, Pavia (IT); Sandro Rossi, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,997

(22) Filed: Jan. 8, 2018

(65) Prior Publication Data

US 2018/0130456 A1    May 10, 2018

Related U.S. Application Data

(63) Continuation of application No. 14/518,894, filed on Oct. 20, 2014, now Pat. No. 9,886,940.

(30) Foreign Application Priority Data

Oct. 21, 2013  (IT) ............................ MI2013A001752

(51) Int. Cl.
  *H03K 5/08*  (2006.01)
  *G10K 11/18*  (2006.01)
  (Continued)

(52) U.S. Cl.
  CPC ............ *G10K 11/18* (2013.01); *B06B 1/0215* (2013.01); *H03K 3/355* (2013.01); *H03K 5/003* (2013.01);
  (Continued)

(58) Field of Classification Search
  None
  See application file for complete search history.

(56) References Cited

U.S. PATENT DOCUMENTS 7,956,653 B1 * 6/2011 Choy ...................... H03F 3/217
                                                          326/83
8,138,805 B2 * 3/2012 Choy ...................... H03F 3/217
                                                          326/83
(Continued)

FOREIGN PATENT DOCUMENTS

WO    2011/063974 A1    6/2011
WO    2011/079883 A1    7/2011

*Primary Examiner* — Long Nguyen
(74) *Attorney, Agent, or Firm* — Seed IP Law Group LLP

(57) ABSTRACT

A device voltage shifter includes a first voltage reference node, a second voltage reference node, an output node and a clamp node. A first high-voltage switching transistor of the voltage shifter has a first conduction terminal coupled to the first voltage reference node and a second conduction terminal coupled to the clamp node. A second high-voltage switching transistor of the voltage shifter has a first conduction terminal coupled to the clamp node and a second conduction terminal coupled to the second voltage reference node. A third high-voltage switching transistor of the voltage shifter has a first conduction terminal coupled to the first voltage reference node, a control terminal coupled to the clamp node, and a second conduction terminal coupled to the output node. A voltage regulator of the voltage shifter is coupled between the output node and the clamp node.

34 Claims, 7 Drawing Sheets

(51) Int. Cl.
*H03K 3/355* (2006.01)
*H03K 5/125* (2006.01)
*H03K 19/0175* (2006.01)
*H03K 19/0185* (2006.01)
*H03K 5/003* (2006.01)
*B06B 1/02* (2006.01)

(52) U.S. Cl.
CPC ..... *H03K 5/125* (2013.01); *H03K 19/017509* (2013.01); *H03K 19/018521* (2013.01); *B06B 2201/76* (2013.01)

(56) References Cited

U.S. PATENT DOCUMENTS

| | | | |
|---|---|---|---|
| 8,542,056 B2 * | 9/2013 | Rossi | B06B 1/0215 |
| | | | 327/108 |
| 8,947,150 B2 * | 2/2015 | Ghisu | H03K 3/356113 |
| | | | 327/333 |
| 9,886,940 B2 * | 2/2018 | Albertini | H03K 3/355 |
| 2007/0016026 A1 | 1/2007 | Thomenius et al. | |
| 2013/0265855 A1 | 10/2013 | Ghisu et al. | |
| 2014/0312954 A1 | 10/2014 | Ghisu et al. | |
| 2016/0294384 A1 | 10/2016 | Schindler et al. | |

* cited by examiner

|  | Transmission channel of Fig. 2 | Prior art transmission channel |
|---|---|---|
| Current flowing during switching | | |
| positive edge | I+1 | $I_P$ |
| negative edge | I | $I_N$ |
| positive clamp | I+1 | $I_P$ |
| negative clamp | I | $I_N$ |

TRANSMIT/RECEIVE CHANNEL FOR ULTRASOUND APPLICATIONS

BACKGROUND

Technical Field

The present disclosure relates to transmit/receive channels for ultrasound applications.

Description of Related Art

An ultrasound imaging or ultrasonography machine is known to be a medical diagnostic testing system that uses ultrasonic waves or ultrasounds and is based on the principle of ultrasound transmission and echo emission analysis and is widely used in internal medicine, surgery and radiology.

Typically used ultrasounds range from 2 to 20 MHz.

Frequency is selected considering that higher frequencies have a greater image resolving power, but penetrate to a shallower depth in the individual under examination.

These ultrasounds are typically generated by a piezoceramic crystal in a probe that is kept in direct contact with the skin of the individual with the interposition of an appropriate gel (which is adapted to eliminate air between the probe and the skin of the individual, thereby allowing ultrasounds to penetrate the anatomic region being examined).

The probe can collect a return signal, or echo, which is appropriately processed by a computer and displayed on a monitor. Particularly, ultrasounds that reach an acoustic impedance variation point, such as an internal organ, are partially reflected and the percentage reflection provides information about impedance differences between the penetrated tissues.

The time that an ultrasonic wave takes to run its path of propagation, reflection and return is provided to the computer, which calculates the depth from which the echo is emitted, and thus identifies the boundary surface between the penetrated tissues (which corresponds to the acoustic impedance variation point and hence to the depth from which the echo is emitted).

A typical transmit/receive or TX/RX channel that is used in these applications is schematically shown in FIG. 1 and generally designated by numeral 1.

Particularly, the transmit/receive channel 1 comprises a high voltage multi-level shifter 2 of the type comprising a branch 3 inserted between a first terminal HVP connected to a positive voltage, and a second terminal HVM, connected to a negative voltage.

In the illustrated example, also referring to FIG. 1A, the shifter 2 allows switching between at least two levels, e.g., the high level, corresponding to the voltage of the first terminal HVP and the low level HVM.

Typical values for the terminal HVP connected to a positive voltage range from 5V to 100V, whereas typical values for the terminal HVM connected to a negative voltage range from −5V to −100V.

The voltage of the output terminal HVout of the level shifter 2 is clamped by a clamping block 4 to a reference voltage, in this example the ground voltage GND, whereby an additional level to be reached by the shifter 2, e,g, GND, is introduced, as shown in FIG. 1A.

It shall be noted that, in a common waveform as shown in such FIG. 1A:

the positive edge is the transition from the HVM value to the HVP value, the negative edge is the transition from the HVP value to the HVM value, the positive clamp is the transition from the HVM value to the GND value and the negative clamp is the transition from the HVP value to the GND value.

The clamping block 4 is substantially a high-voltage switch inserted between said output terminal HVout of the level translator 2 and the ground voltage GND.

Particularly, the clamping block 4 comprises a first driver DRC1, which is designed to control the gate terminal of a first clamping transistor P2, which is in turn inserted in series with a first clamping diode DC1, between the voltage reference GND, particularly a ground, and a central node XCc.

The clamping block 4 comprises a second driver DRC2, which is designed to control the gate terminal of a second clamping transistor N3, which is in turn inserted in series with a second clamping diode DC2, between the voltage reference GND, particularly a ground, and a central node XCc.

The central clamping node XCc is further interconnected with the output terminal HVout of the transmission channel 1, which is in turn connected to a connection terminal Xdcr for the piezoelectric transducer 5 to be controlled by the transmission channel 1.

More in detail, the high-voltage shifter 2 comprises a first branch, having a first switching transistor P1 and a second switching transistor N2, which are inserted in series with each other between the first higher voltage reference terminal HVP and the first lower voltage reference terminal HVM. The first and second transistors P1 and N2 have respective control terminals connected to and controlled by first DRP1 and second DRN2 input drivers, and the respective drain terminals connected together.

It shall be noted that the first switching transistor P1 is a high-voltage P-channel MOS transistor (HV Pmos), whereas the second switching transistor N2 is a high-voltage N-channel MOS transistor (HV Nmos), whereas the first and second transistors P2, N3 of the clamping block 4 are always high-voltage transistors, of P-MOS and N-MOS types respectively, but can withstand a lower supply voltage (e.g., 100 V against the 200 V of the first and second switching transistors P1, N2).

Therefore, in classical ultrasonic solutions, the level shifter is obtained using asymmetric output stages (NMOS and PMOS) which generate a second harmonic distortion.

Thus, when the transmit channel 1 is required to be switched from a high-voltage level (e.g., HVP) to a low-voltage level (e.g., HVM) or vice versa, through the positive and/or negative clamping steps, the shifter 2, which is constructed with MOS transistors of different types (Nmos vs Pmos), with the clamping block being constructed with transistors of different classes, has different transitions to the output terminal HVout depending on whether the shifter is switched to a high-voltage value or a low-voltage value.

This asymmetry in the rising or falling edge of the voltage signal to the terminal HVout causes a second harmonic component to be introduced into the emitted signal, and thus disturb later second-harmonic analysis on the reflected echo.

Generally, this asymmetry may be minimized according to the current/voltage characteristics of the two Nmos and Pmos transistors, by having them operate in appropriate range of operating conditions (such as output load and operating voltage).

Nevertheless, this optimization is not stable and accurate and especially, with changing operating conditions, it may lead to a considerable degradation of performances, possibly to 10 db lower attenuation of the transmitted second harmonic component.

This introduced asymmetry particularly affects the percentage of the reflected acoustic signal, which carries information about the difference in impedance between the penetrated tissues.

This second harmonic distortion is tolerated (in non-high-quality applications), when it is attenuated by about 30 db to 40 db with respect to the value of the carrier of the generated acoustic signal.

Nevertheless, due to this distortion, the images of the region to be observed are generated with a resolution that is lower than the one that might be obtained without such asymmetry.

BRIEF SUMMARY

The present disclosure relates to a transmit/receive channel for ultrasound applications inserted between a connecting terminal and an output terminal of a transmit channel, and of the type comprising at least one first and one second communication transistors, inserted in series with each other between the connecting terminal and the output terminal, e.g., for use in an ultrasound imaging or ultrasonography machine.

An embodiment facilitates providing a transmit/receive channel for ultrasound applications, that may provide a substantially symmetric transition of the voltage value at its output terminal, to limit the introduction of a second-harmonic asymmetry.

An embodiment facilitates providing a transmit/receive channel for ultrasound applications that uses the high-voltage multi-level shifter to generate better defined images (with improved resolution) and/or identify the conformation of the internal organ with higher accuracy.

In one embodiment, a transmit/receive channel may be obtained, in which switching is carried out with substantially the same current value, which facilitates making the structure symmetrical.

In an embodiment, the area covered by the transmit/receive channel is, to a first approximation, equal to that covered by a traditional transmit/receive channel, and the symmetry of signals is generally independent of the supply voltage and, to a first approximation, of the load.

In an embodiment, a transmit/receive channel for ultrasound applications comprises a high-voltage multi-level shifter, having an output terminal whose output voltage is clamped by a clamp block to a reference voltage, said output terminal being connected to a connection terminal for a piezoelectric transducer to be controlled through the transmit/receive channel, said multi-level shifter comprising: a first switching transistor and a second switching transistor, which are inserted in series with each other between a first higher voltage reference terminal and a first lower voltage reference terminal, said first and second transistors have respective control terminals connected to and controlled by first and second input drivers, which are designed to generate a respective control voltage, and the respective drain terminals connected together in said output terminal, said first switching transistor being a high-voltage P-channel MOS transistor, and said second switching transistor being a high-voltage N-channel MOS transistor, said multi-level shifter comprises: a third switching transistor, inserted in series between said first higher voltage reference terminal and said output terminal, said third transistor having its control terminal connected to and controlled by said drain terminal of said first switching transistor, said third switching transistor being a high-voltage N-channel MOS transistor, said second and third switching transistors being MOS transistors configured as having the same current-carrying capacity, voltage regulator means, inserted in series between said source terminal of said third switching transistor and said drain terminal of said second switching transistor, being designed to supply first and second voltage values, each being a function of the control voltage value supplied by said first control driver or said second control driver. In an embodiment, said clamping block comprises a first clamping driver, which is designed to control a gate terminal of a first clamping transistor, which is in turn inserted in series with a first clamping diode, between a voltage reference, and a clamping node, and a second clamping driver, which is designed to control a gate terminal of a second clamping transistor, which is in turn inserted in series with a second clamping diode, between said voltage reference and said clamping node, said first clamping transistor and said second clamping transistor being designed to supply the same current amount as said first switching transistor and said second and third switching transistors respectively. In an embodiment, said voltage regulator means comprise a Zener diode having its cathode terminal connected to said drain terminal of said second switching transistor and its anode terminal connected to a source terminal of said third switching transistor. In an embodiment, said voltage regulators comprise a plurality of diodes in series arrangement and a diode in antiparallel arrangement. In an embodiment, said first voltage value is equal to a control voltage adapted to turn on said first switching transistor or to turn on said second switching transistor. In an embodiment, said second voltage value is equal to a control voltage adapted to turn off said first switching transistor or to turn off said second switching transistor.

In an embodiment, a device comprises: a first voltage reference node; a second voltage reference node; an output node; a clamp node; a first high-voltage switching transistor having a first conduction terminal coupled to the first voltage reference node and a second conduction terminal coupled to the clamp node; a second high-voltage switching transistor having a first conduction terminal coupled to the clamp node and a second conduction terminal coupled to the second voltage reference node; a third high-voltage switching transistor having a first conduction terminal coupled to the first voltage reference node, a control terminal coupled to the clamp node, and a second conduction terminal coupled to the output node; and a voltage regulator coupled between the output node and the clamp node. In an embodiment, the second and third high-voltage switching transistors have substantially identical operating characteristics. In an embodiment, the voltage regulator comprises a Zener diode. In an embodiment, a cathode terminal of the Zener diode is coupled to a drain terminal of the second high-voltage switching transistor and an anode terminal of the Zener diode is coupled to a source terminal of the third high-voltage switching transistor. In an embodiment, the voltage regulator comprises: a first plurality of diodes coupled together in series between the output node and the clamp node; and a diode coupled in antiseries across the first plurality of diodes. In an embodiment, in operation, the output node provides an ultrasound transducer drive signal. In an embodiment, the device comprises a first input driver coupled to a control terminal of the first high-voltage switching transistor; and a second input driver coupled to a control terminal of the second high-voltage switching transistor. In an embodiment, the first high-voltage switching transistor is a PMOS transistor, the second high-voltage switching transistor is an NMOS and the third high-voltage switching transistor is an NMOS.

In an embodiment, a system comprises: a high-voltage shifter having: a first voltage reference node; a second voltage reference node; an output node; a clamp node; a first high-voltage switching transistor having a first conduction terminal coupled to the first voltage reference node and a second conduction terminal coupled to the clamp node; a second high-voltage switching transistor having a first conduction terminal coupled to the clamp node and a second conduction terminal coupled to the second voltage reference node; a third high-voltage switching transistor having a first conduction terminal coupled to the first voltage reference node, a control terminal coupled to the clamp node, and a second conduction terminal coupled to the output node; and a voltage regulator coupled between the output node and the clamp node; and a voltage clamp coupled to the clamp node and to a third voltage reference node. In an embodiment, the voltage clamp comprises: a first clamp switching transistor having a first conduction terminal coupled to the third voltage reference node; a first diode coupled to the clamp node and to a second conduction terminal of the first clamp switching transistor; a second clamp switching transistor having a first conduction terminal coupled to the third reference voltage node; and a second diode coupled to the clamp node and to a second conduction terminal of the second clamp switching transistor. In an embodiment, the first high-voltage switching transistor and the first clamp switching transistor are transistors having substantially identical operational characteristics; and the second high-voltage switching transistor, the third high-voltage switching transistor and the second clamp transistor are transistors having substantially identical operational characteristics. In an embodiment, the first clamp transistor is a PMOS transistor and the second clamp transistor is an NMOS transistor. In an embodiment, the system comprises: a first input driver coupled to a control terminal of the first high-voltage switching transistor; a second input driver coupled to a control terminal of the second high-voltage switching transistor; a third input driver coupled to a control terminal of the first clamp switching transistor; and a fourth input driver coupled to a control terminal of the second clamp switching transistor. In an embodiment, the system comprises a controller, which, in operation, generates control signals to control the input drivers. In an embodiment, the system comprises: an ultrasound transducer coupled to the output node. In an embodiment, the voltage regulator comprises a Zener diode. In an embodiment, wherein the voltage regulator comprises: a first plurality of diodes coupled together in series between the output node and the clamp node; and a diode coupled in antiseries across the first plurality of diodes.

In an embodiment, a method comprises: in a first mode of operation of an ultrasound system, conducting a bias current through a first switching transistor and a voltage regulator of a voltage shifter; conducting a driving current through a second switching transistor of the voltage shifter; and conducting a sum of the bias current and the driving current through an ultrasound transducer; in a second mode of operation of the ultrasound system, conducting the driving current through the ultrasound transducer, the voltage regulator and a third switching transistor of the voltage shifter; in a third mode of operation of the ultrasound system, conducting the bias current through a first clamp transistor and the voltage regulator; conducting the driving current through second switching transistor of the voltage shifter; and conducting the sum of the bias current and the driving current through the ultrasound transducer; and in a fourth mode of operation of the ultrasound system, conducting the driving current through the ultrasound transducer and a second clamp transistor. In an embodiment, the first switching transistor of the voltage shifter and the first clamp transistor are PMOS transistors having substantially identical operational characteristics. In an embodiment, the second switching transistor of the voltage shifter, the third switching transistor of the voltage shifter and the second clamp transistor are NMOS transistors having substantially identical operational characteristics. In an embodiment, the voltage regulator comprises a Zener diode.

BRIEF DESCRIPTION OF THE SEVERAL VIEWS OF THE DRAWINGS

Characteristics and advantages of the present disclosure will appear from the following detailed description of a possible practical embodiment, illustrated as a non-limiting example in the set of drawings, in which.

DETAILED DESCRIPTION

Although this is not expressly shown, the individual features described with reference to each embodiment shall be intended as auxiliary and/or interchangeable with other features, as described with reference to other embodiments.

The present disclosure relates to a transmit/receive channel 1 for ultrasound applications that uses a high-voltage multi-level shifter.

Parts that have been described with reference to the prior art will be designated hereinbelow, for simplicity, by the same numerals, unless the context indicates otherwise.

Figure 1:
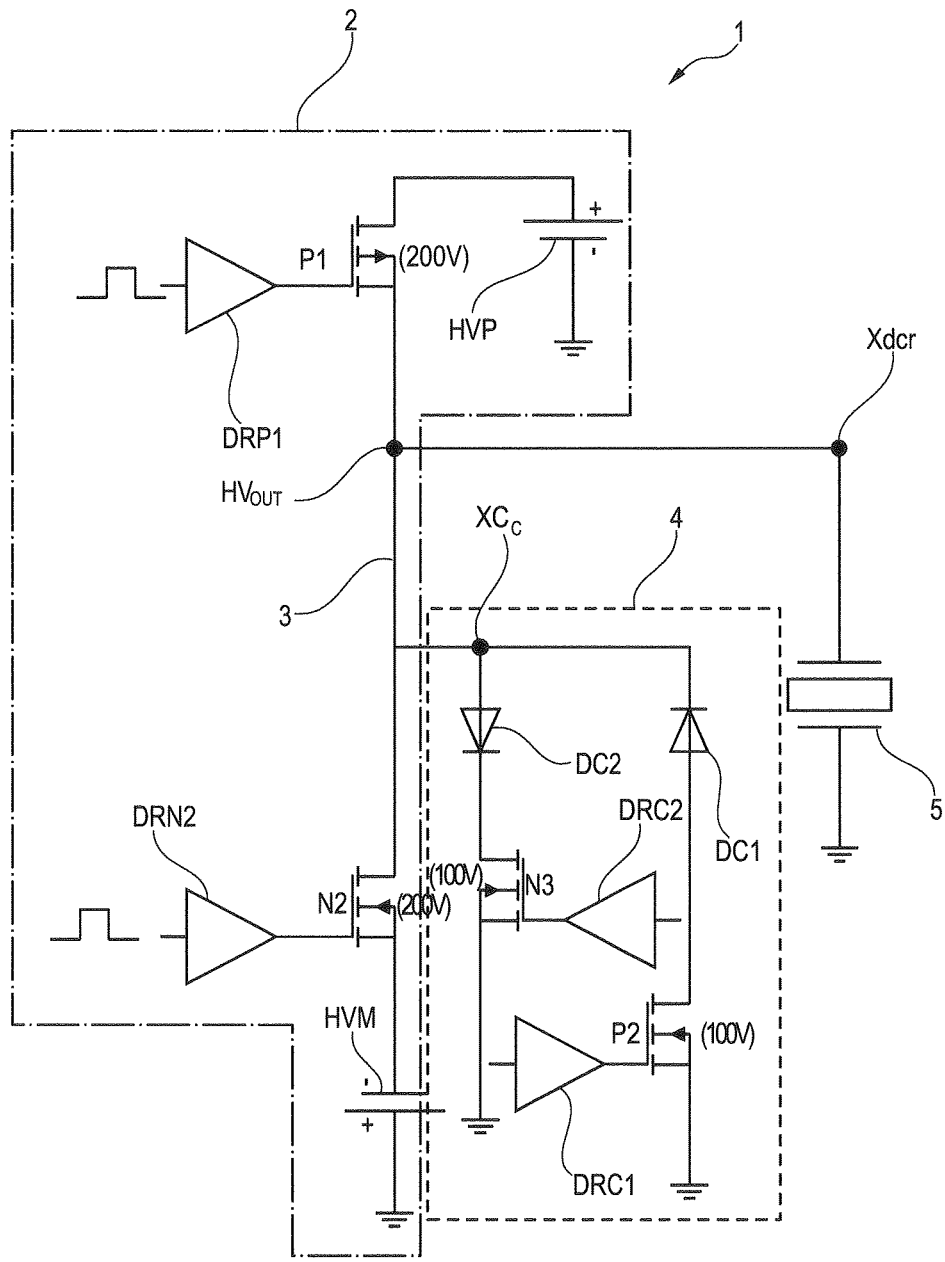
FIG. 1 shows a prior art transmit/receive circuit for ultrasound applications.
Figure 1A:
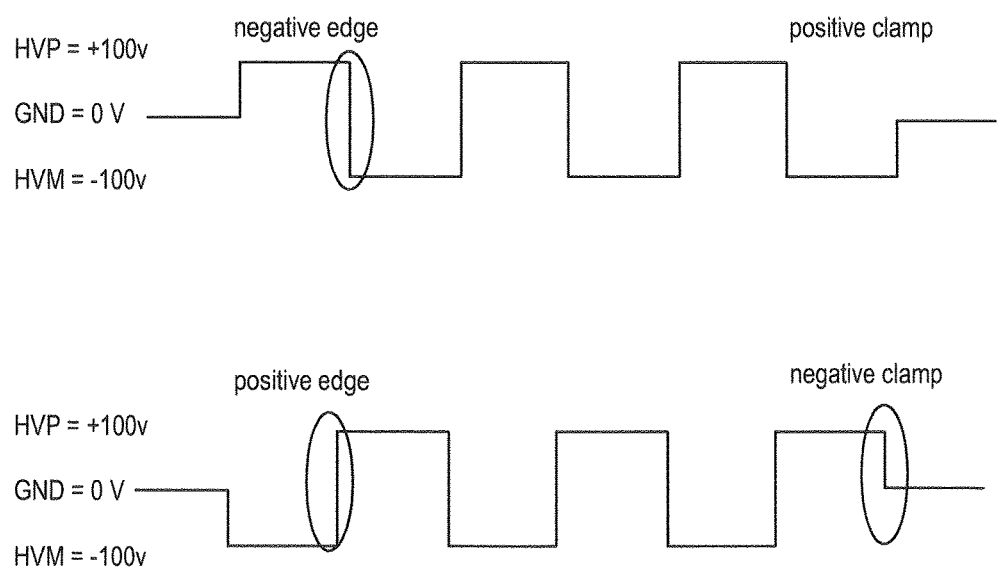
FIG. 1A shows the possible switching edges of the transmit/receive channel of FIG. 1.
Figure 2A:
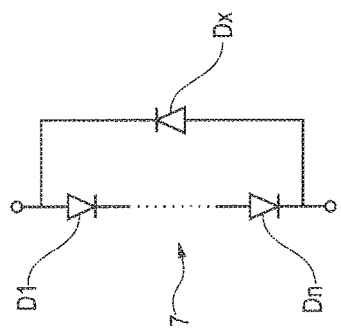
FIG. 2A shows an embodiment of an element that may be part of the transmit/receive circuit as shown in FIGS. 2, 3, 4 and 5.
Figure 2:
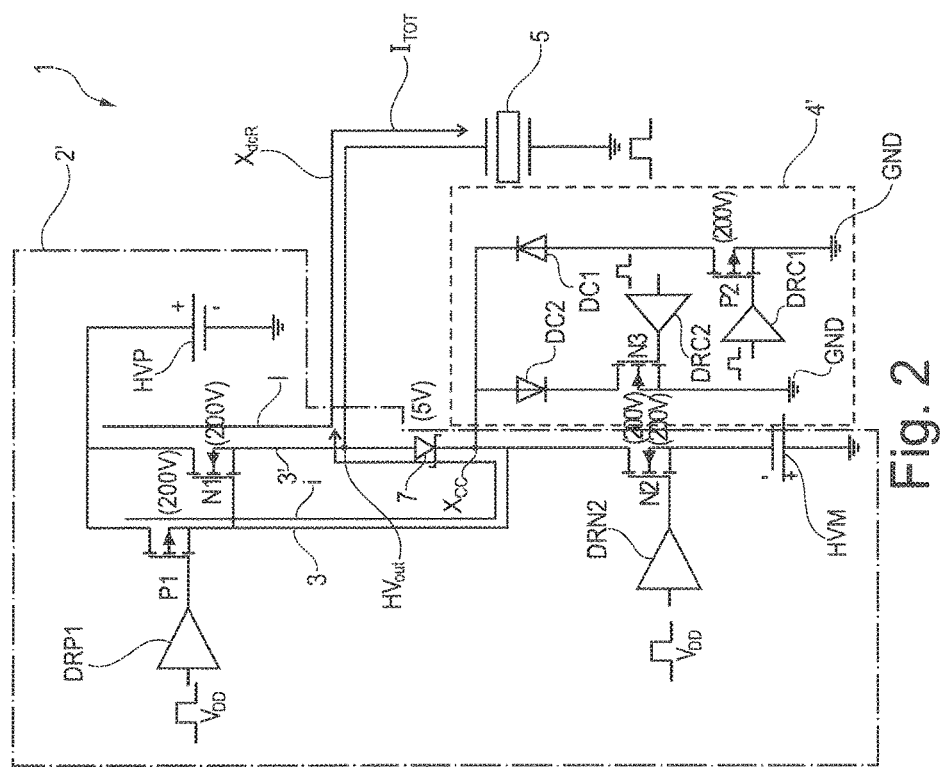
FIGS. 2, 3, 4 and 5 show embodiments of a transmit/receive circuit for ultrasound applications, comprising a high-voltage multi-level shifter, with the curves of currents in various operating modes, such as positive edge (FIG. 2), negative edge (FIG. 3), positive clamp (FIG. 4), negative clamp (FIG. 5)
Figure 2:
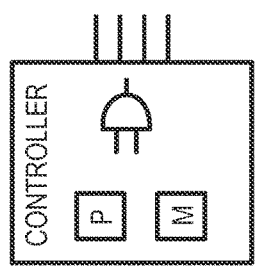

Referring to FIG. 2, the transmit/receive channel 1 comprises a multi-level shifter that, in addition to what has been described with reference to FIG. 1, has a second branch 3', parallel to the first branch 3, and having:

a third switching transistor N1 inserted in series between the first higher voltage reference terminal HVP and the output terminal HVout, which has its own control terminal (e.g., the gate terminal) connected to and controlled by the drain terminal of the first switching transistor P1, a voltage regulator 7, inserted in series between the source terminal of the third switching transistor N1 and the drain terminal of the second switching transistor N2.

In an embodiment, the voltage regulator 7 is inserted in series between the output terminal HVout and the central clamping node XCc.

As illustrated, the third switching transistor N1 is a high-voltage N-channel MOS transistor HV Nmos and is designed to have the same current-carrying capacity as the second switching transistor N2, which for example may be implemented with the same technological process, have substantially identical electrical performances, and are able to carry the same amount of current.

For example, the switching transistors P1, N2 and N1 may designed to operate with a supply voltage of 200 V or 100 V.

In an embodiment, the voltage regulator 7 is designed to supply first and second voltage values V1, V2, according to the control voltage value VDD set by the first driver DRP1 for the first switching transistor P1 or, equivalently, to the voltage value supplied by the driver DRN2, to control the second switching transistor N2.

It shall be noted that this first and second voltage values V1, V2 are supplied according to the operating states of the transmit/receive channel 1 as described in greater detail below.

In an embodiment, the control voltage VDD set by the drivers DRP1, DRN2 of the level shifter 20 and by the drivers DRC1, DRC2 of the clamping block 4' has the same progress, e.g., this control voltage ranges from a low value, for example of 0 Volt and a high value for example of 5 Volt or 3 Volt.

Assuming the above, if the driver DRP1 sets a control voltage VDD of 5 V (or 3 V) for the gate terminal of the first switching transistor P1, then the first switching transistor P1 will be switched on (Vgs_P1 equal to 5V), and the voltage regulator 7 will have such voltage value VDD at their ends, e.g., V1=VDD=5V (or 3V).

In an embodiment, these voltage regulators 7 are designed to supply a second voltage value V2 other than the first voltage value V1. For example, this second voltage value V2 may be substantially zero.

Thus, if the control voltage VDD set by the driver DRP1 for the switching transistor P1 is the power-off voltage (i.e., when the driver DRP1 sets a voltage VDD of zero Volt, e.g., Vgs_P1=0V) then the voltage regulator 7 will supply such new voltage value VDD, e.g., V2=VDD=0V.

In an embodiment, the transmit/receive channel 1 comprises a block 4', which is of the same type as that described with reference to FIG. 1, except that the first clamping transistor P2 is designed to have the same current-carrying capacity as the first switching transistor, and that the second clamping transistor N3 is designed to have the same current-carrying capacity as the second and third switching transistors N2 and N1.

In other words, these transistors are designed and implemented to carry the same amount of current.

In an embodiment, the first clamping transistor P2 and the second clamping transistor N3 are MOS transistors and are designed to operate with a supply voltage of 200 V or 100 V.

In an embodiment, also referring to FIG. 2, the voltage regulator 7 comprises a Zener diode.

This embodiment allows the so-called Zener voltage Vz to be equal to the control voltage VDD set by the control driver DRP1 (or DRN2). Thus, if the control voltage VDD is 5V, then the Zener voltage Vz will be equal to VDD and if VDD is zero, then the Zener diode will behave like a normal diode, whose voltage at its anode and cathode terminals is substantially zero Volt.

According to another embodiment, as shown in FIG. 2A, the voltage regulator 7 comprises a plurality "n" of diodes D1, ..., Dn, in series arrangement and an additional diode Dx in antiparallel arrangement.

In an embodiment, these diodes D1, ..., Dn and Dx are low-voltage diodes constructed with substantially identical electric specifications.

For example, in order to have a voltage value that is equal to the control voltage value VDD set by the control driver DRP1 (or DRP2), the plurality "n" of diodes may comprise as many diodes D1, ... Dn as to attain the control voltage value VDD.

For instance, if the control voltage VDD is 3 V, then the number "n" of the plurality of diodes may be five, providing a voltage value of 3.3 V (as a sum of the voltages of the five diodes), which is higher than the control voltage VDD to switch on the second transistor N2.

In an embodiment, MOS transistors in transdiode configuration are used instead of the diodes D1, ..., Dn. For example, if a control voltage VDD of 3 Volt (namely 3.3 Volt) is provided, then three MOS transistors in transdiode configuration may be implemented between the MOS P1 and the MOS N1.

Concerning the operation of the multi-level shifter 2' which, as shown in this FIG. 2, allows shifting or switching between three levels, e.g., a high level substantially equal to the voltage value of the first positive reference terminal HVP, another level substantially equal to the voltage value of the first negative reference terminal HVM, and the third level substantially equal to the value of the ground reference voltage GND, it will be noted that, if a control voltage VDD=0 Volt is set between the gate and source of P1 by respective drivers DRP1 and DRN2, which is equal to the control voltage between the gate and source of N2, then the output terminal XDCR of the transmit/receive channel 1 is at zero voltage.

Referring now to FIG. 2, when the value at the output terminal HVout has to be switched from the low value HVM to the high value HVP, then the transistor P1 is turned on (while the switching transistor N2 is off, as VDD=Vgs_N2=0 Volt).

When the transistor P1 is turned on through the driver DRM1 and its gate-source voltage Vgs_P1 is forced to the control voltage VDD, where VDD is the control voltage for such transistor N1 (e.g., 3V or 5V), a current "i" starts to flow between the nodes XCc and HVout, and turns on the voltage regulator 7 to set the first voltage V1=VDD (e.g., 5 V) between its terminals.

This voltage V1 turns on the switching transistor N1, which in turn allows a current "I" to flow toward the node HVout.

Thus, a current Itot, e.g., the sum of the current "i" and the current "I", flows into the piezoelectric transducer 5.

In an embodiment, the current "i" is simply a bias current for the voltage regulator 7 and has a value that is lower than the value of the current "I" that flows through the transistor N1 by several orders of magnitude.

For example, typical values for the current "i" are a few tens of microampere, whereas typical values for the current "I" are a few tens of milliampere.

To a good approximation, the value of the current "i" is negligible with respect to the value of the current "I", and a current Itot substantially equal to "I" flows through the piezoelectric transducer 5.

As illustrated, FIG. 2 includes a controller having a processor P, a memory M and discrete circuitry, which, in operation provides one or more control signals to control, for example, the drivers DRP1, DRN2, DRC1 and DRC2.

Figure 3:
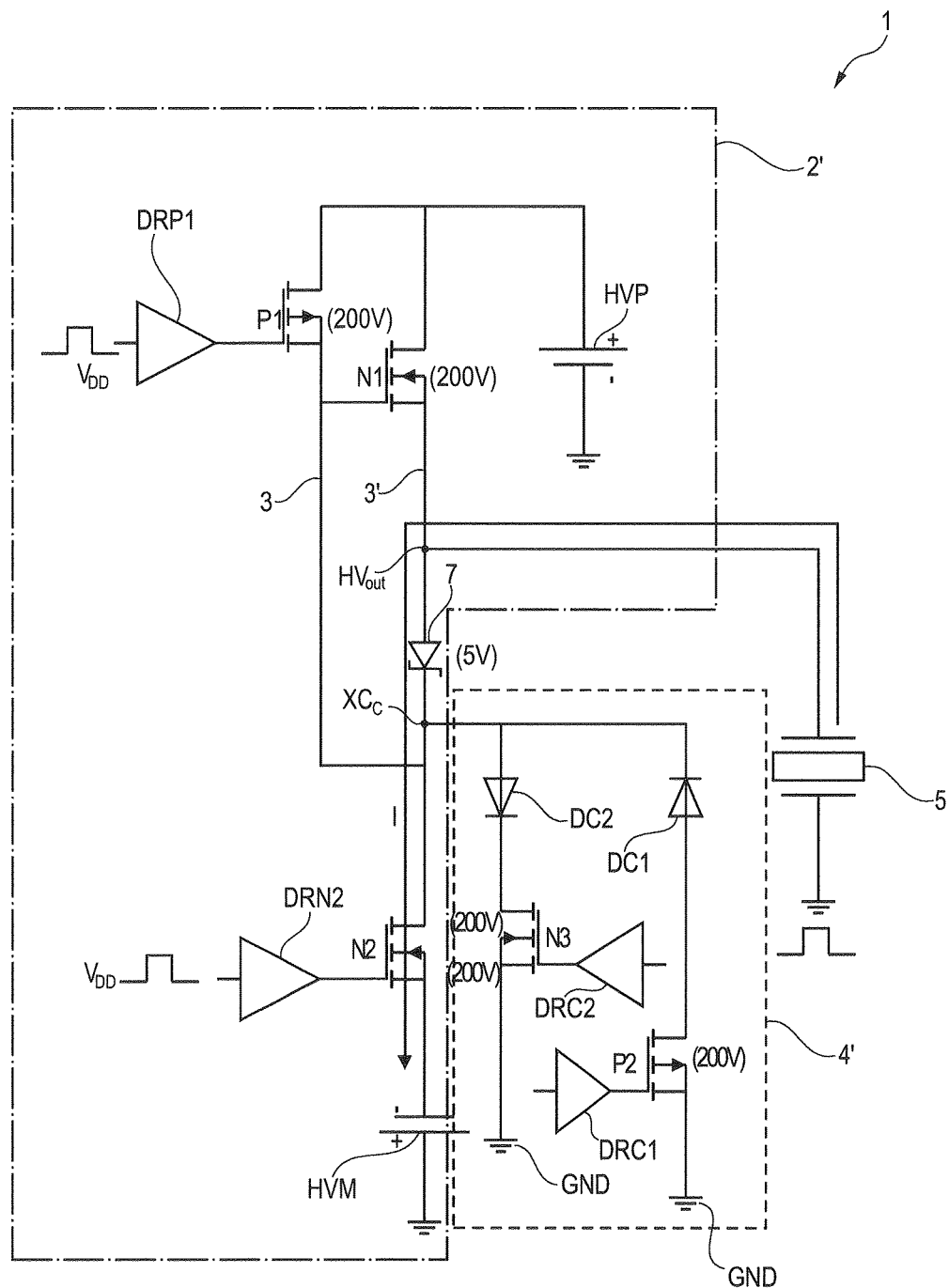

Referring now to FIG. 3, when the value at the output terminal HVout is to be switched from the high value HVP to the low value HVM, then the switching transistor P1 is turned off (by setting the voltage VDD=Vgs_P1=0 Volt), and the switching transistor N2 is turned on, e.g., the driver DRN2 sets a control voltage VDD for example of 5 V between the gate and the source of the transistor N2.

Therefore, a current "I" starts to flow from the piezoelectric transducer 5 toward such switching transistor N2, which current has the same value as the current "I" that was generated by the transistor N1, because the transistors N2 and N1 have the same physical and electric properties and have the same potential different value between their respective gate and source terminals.

In an embodiment, the voltage regulator 7 has the second voltage value V2 equal to the control voltage VDD set by the driver DRP1, e.g., V2=VDD=0 Volt.

Since the transistors N1 and N2 carry the same current "I", these switching processes may become symmetrical, facilitating optimal performance throughout the switching range.

In an embodiment employing the shifter 2' with the transmit/receive channel 1, both switching processes to the high voltage value and the low voltage value are carried out with the same current values, e.g., "I".

This facilitates making the transmit/receive channel 1 symmetrical, and with symmetry of transitions, and facilitates reducing the introduction of second harmonic noise.

In an embodiment, the transition symmetry may be obtained regardless of the supply voltage and, to a first approximation, also regardless of the load.

Figure 4:
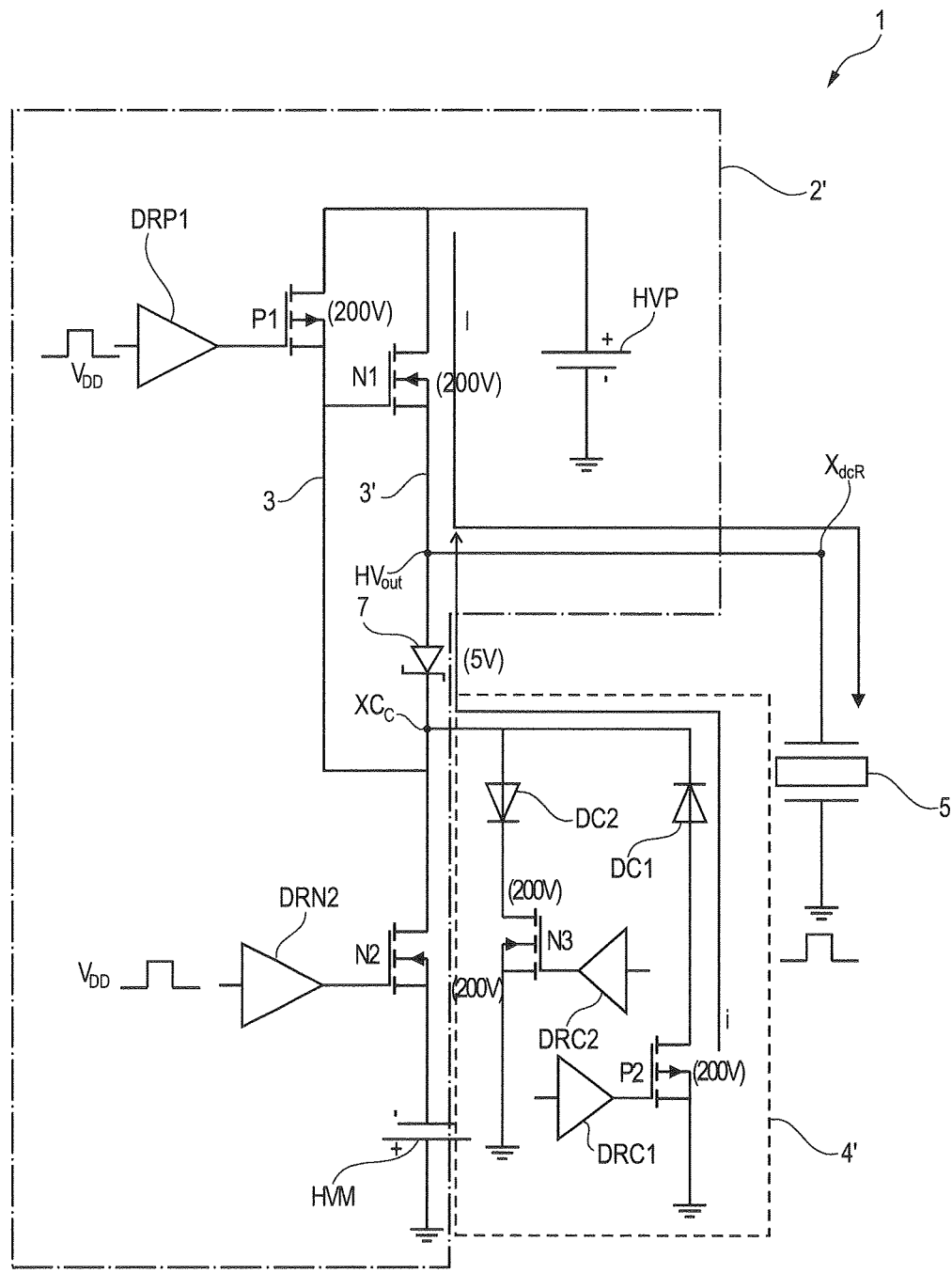

Referring now to FIG. 4, when the value at the output terminal HVout is to be switched from the low value HVP to the reference value GND (e.g., the positive clamp), then the switching transistor P1 is turned off (the driver DRP1 sets a VDD=Vgs_P1=0 Volt), and the clamping transistor P2 is turned on through the clamping driver DRC1 which sets a control voltage VDD for example of 5V.

Once the clamping transistor P2 is turned on, a current "i" flows into the voltage regulator 7, such that the latter has at its ends the voltage to turn on the transistor N1, which in turn generates the current "I" that will flow with the current "i" generated by the clamping transistor P2 into the piezoelectric transducer 5, to reach the positive clamp state.

In other words, during positive clamp switching, a total current Itot will flow into the piezoelectric transducer 5, which is given by the sum of the current "i" generated by the clamping transistor P2 and the current "I" generated by the transistor N1.

In an embodiment, once the clamping transistor P2 is on, the switching transistor N2 will be also turned on.

Also in this operating mode, the current "i" generated by the clamping transistor P2 may be substantially negligible as compared with the current I generated by the switching transistor N1, as the current "i" is a bias current for the voltage regulator 7 and hence the output terminal HVout is switched from the low value HVP to the reference value GND by the current I.

Figure 5:
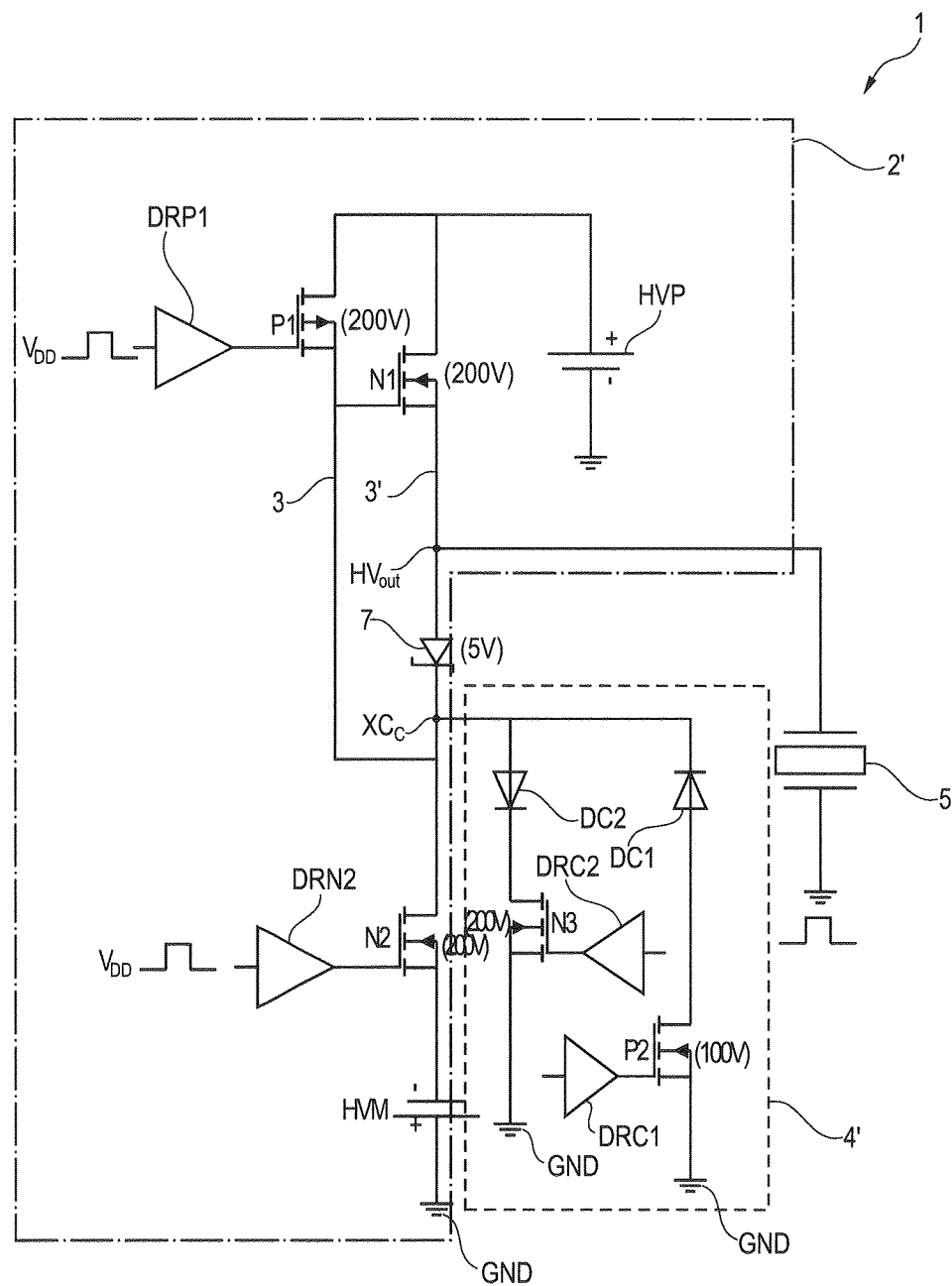

Referring now to FIG. 5, when the value at the output terminal HVout is to be switched from the low value HVP to the reference value GND (e.g., the negative clamp), then the clamping transistor N3 is turned on, as its driver DRC2 sets the voltage VDD for its control terminal (e.g., VDD=Vgs_N3=e.g., 5V).

The other transistors of the transmit/receive channel 1 are off.

Therefore, the current "I" flows from the piezoelectric transducer 5 to the clamping transistor N3, as the voltage regulator 7 has a voltage VDD=VGS_P1=0V, to reach the negative clamp state.

In an embodiment, the clamping transistor N3 has substantially the same electric and physical properties as the switching transistors N1 and N2, the current value "I" generated by the clamping transistor N3 is substantially identical to that generated by the switching transistor N1.

Therefore, also referring to FIG. 6, the transmit/receive channel of the present disclosure will be switched by a substantially identical current value I, whereby the structure will be symmetrical for both levels, and also for clamp switching, considering that in a channel as described with reference to FIG. 1, currents were different because they were supplied by transistors of different types (P-Mos vs. N-Mos).

Figures 6, 7:
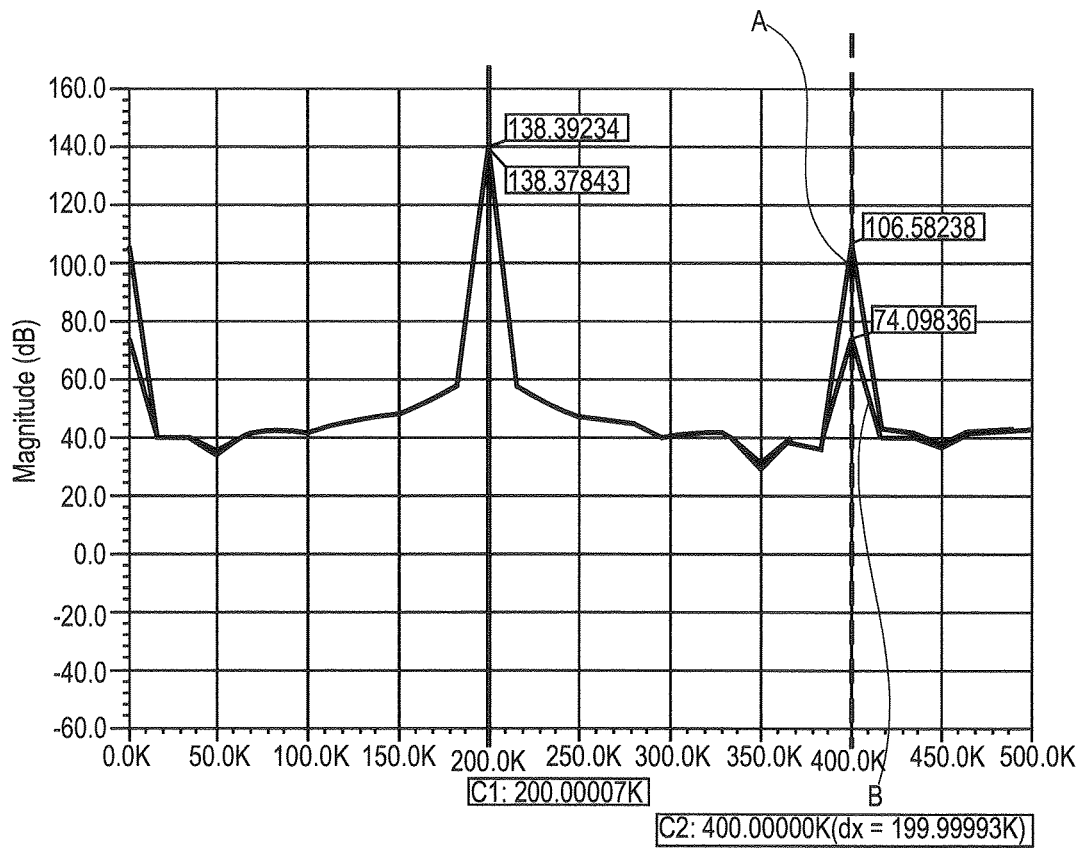
FIG. 6 shows a table that compares the currents circulating in the transmit/receive channel of FIG. 1 during possible switching edges, with the currents circulating in the transmit/receive channel of an embodiment of the present disclosure.
FIG. 7 shows a chart that compares the symmetry performances of a transmit/receive circuit for ultrasound applications according to the prior art and of a transmit/receive circuit for ultrasound applications according to an embodiment of the present disclosure.

Referring now to FIG. 7, there is shown a chart that compares the FFTs of the waveforms resulting from a transmit/receive circuit for ultrasound applications according to the prior art A and a transmit/receive circuit for ultrasound applications according to an embodiment of the present disclosure B, using the same input control signal.

It may be particularly appreciated that the transmit/receive circuit for ultrasound applications A has a second harmonic value of 106.58238 db whereas the transmit/receive circuit for ultrasound applications B has a second harmonic value of 74.09386 db, e.g., considerably lower than in the prior art.

Due to this difference, an embodiment of the transmit/receive circuit for ultrasound applications of the present disclosure (e.g., the circuit B of the present disclosure) provides image symmetry performances in the imaged area that afford a higher resolution as compared with that obtained using a prior art circuit (e.g., the circuit referenced "A" in FIG. 7).

Those skilled in the art will obviously appreciate that a number of changes and variants may be made to the transmit/receive channel for ultrasound applications as described above to fulfill particular requirements, without departure from the scope of the disclosure, as defined in the following claims.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a first high-voltage switching circuit;
a second high-voltage switching circuit;
a first branch including an output node, the first branch coupling the first high-voltage switching circuit to the second high-voltage switching circuit, wherein the first branch, in operation, conducts an ultrasound transducer drive signal; and
a second branch, separate from the first branch, coupling the first high-voltage switching circuit to the second high-voltage switching circuit, wherein the second branch, in operation, conducts a biasing current to bias the first branch.

2. The device of claim 1, comprising a clamp node coupled to the second high-voltage switching circuit, wherein the first branch and the second branch are coupled between the first high-voltage switching circuit and the clamp node.

3. The device of claim 1, comprising:
a first reference-voltage node, wherein the first high-voltage switching circuit is coupled between the first reference-voltage node and the first and second branches, and in operation, the first high-voltage switching circuit selectively couples the first reference-voltage node to the first and second branches; and
a second reference-voltage node, wherein the second high-voltage switching circuit is coupled between the second reference-voltage node and the first and second branches, and in operation, the second high-voltage switching circuit selectively couples the second reference-voltage node to the first and second branches.

4. The device of claim 3 wherein the first high-voltage switching circuit comprises:
a first high-voltage switch coupled between the first voltage-reference node and the first branch; and
a second high-voltage switch coupled between the first voltage-reference node and the second branch.

5. The device of claim 4 wherein the second high-voltage switching circuit comprises a third high-voltage switch coupled between the second voltage-reference node and the first and second branches.

6. The device of claim 5 wherein the first high-voltage switch and the third high-voltage switch have substantially identical operating characteristics.

7. The device of claim 6 wherein the first high-voltage switch and the third high-voltage switch comprise NMOS transistors and the second high-voltage switch comprises a PMOS transistor.

8. The device of claim 1 wherein the first branch comprises a voltage regulator.

9. The device of claim 8 wherein the voltage regulator is coupled between a clamp node and an output node of the device.

10. The device of claim 8 wherein the voltage regulator comprises a Zener diode.

11. The device of claim 10 wherein a cathode terminal of the Zener diode is coupled to the second high-voltage switching circuit and an anode terminal of the Zener diode is coupled to the first high-voltage switching circuit.

12. A device, comprising:
a first high-voltage switching circuit;
a second high-voltage switching circuit;
a first branch, coupled between the first high-voltage switching circuit and the second high-voltage switching circuit, wherein the first branch, in operation, conducts an ultrasound transducer drive signal; and
a second branch, coupled between the first high-voltage switching circuit and the second high-voltage switching circuit, wherein the second branch, in operation, conducts a biasing current to bias the first branch, wherein the first branch includes a voltage regulator having:

a first plurality of diodes coupled together in series between the first high-voltage switching circuit and the second high-voltage switching circuit; and
an additional diode coupled in antiparallel arrangement with the first plurality of diodes.

13. A system, comprising:
a high-voltage shifter having:
a clamp node;
a first high-voltage switching circuit;
a second high-voltage switching circuit;
a first branch including an output node, the first branch coupling the first high-voltage switching circuit to the second high-voltage switching circuit, wherein the first branch, in operation, conducts an ultrasound transducer drive signal; and
a second branch, separate from the first branch, coupling the first high-voltage switching circuit to the second high-voltage switching circuit, wherein the second branch, in operation, conducts a biasing current to bias the first branch; and
a voltage clamp coupled to the clamp node.

14. The system of claim 13, comprising:
a first input driver coupled to a control terminal of the first high-voltage switching circuit; and
a second input driver coupled to a control terminal of the second high-voltage switching circuit.

15. The system of claim 14, comprising a controller, which, in operation, generates control signals to control the input drivers.

16. A system, comprising:
a high-voltage shifter having:
a clamp node;
a first high-voltage switching circuit;
a second high-voltage switching circuit;
a first branch coupled between the first high-voltage switching circuit and the second high-voltage switching circuit, wherein the first branch, in operation, conducts an ultrasound transducer drive signal; and
a second branch coupled between the first high-voltage switching circuit to the second high-voltage switching circuit, wherein the second branch, in operation, conducts a biasing current to bias the first branch; and
a voltage clamp coupled to the clamp node, wherein the voltage clamp comprises:
a first clamp switching transistor having a first conduction terminal coupled to a ground node;
a first diode coupled to the clamp node and to a second conduction terminal of the first clamp switching transistor;
a second clamp switching transistor having a first conduction terminal coupled to the ground node; and
a second diode coupled to the clamp node and to a second conduction terminal of the second clamp switching transistor.

17. The system of claim 16 wherein the high-voltage shifter comprises:
a first reference-voltage node, wherein the first high-voltage switching circuit is coupled between the first reference-voltage node and the first and second branches, and in operation, the first high-voltage switching circuit selectively couples the first reference-voltage node to the first and second branches; and
a second reference-voltage node, wherein the second high-voltage switching circuit is coupled between the second reference-voltage node and the first and second branches, and in operation, the second high-voltage switching circuit selectively couples the second reference-voltage node to the first and second branches.

18. The system of claim 17 wherein the first high-voltage switching circuit comprises:
a first high-voltage switch coupled between the first voltage-reference node and the first branch; and
a second high-voltage switch coupled between the first voltage-reference node and the second branch.

19. The system of claim 18 wherein the second high-voltage switching circuit comprises a third high-voltage switch coupled between the second voltage-reference node and the first and second branches.

20. The system of claim 19 wherein the first high-voltage switch, the third high-voltage switch and the second clamp switching transistor have substantially identical operating characteristics.

21. The system of claim 20 wherein,
the first high-voltage switch, the third high-voltage switch and the second clamp switching transistor comprise NMOS transistors; and
the second high-voltage switch and the first clamp switching transistor comprise PMOS transistors.

22. The system of claim 13 wherein the first branch comprises a voltage regulator.

23. The system of claim 22 wherein the voltage regulator is coupled between the clamp node and an output node of the high-voltage shifter.

24. The system of claim 22 wherein the voltage regulator comprises a Zener diode.

25. A system, comprising:
a high-voltage shifter having:
a clamp node;
a first high-voltage switching circuit;
a second high-voltage switching circuit;
a first branch, coupled between the first high-voltage switching circuit and the second high-voltage switching circuit, wherein the first branch, in operation, conducts an ultrasound transducer drive signal; and
a second branch, coupled between the first high-voltage switching circuit and the second high-voltage switching circuit, wherein the second branch, in operation, conducts a biasing current to bias the first branch; and
a voltage clamp coupled to the clamp node, wherein the first branch comprises a voltage regulator, the voltage regulator having:
a first plurality of diodes coupled together in series between the first high-voltage switching circuit and the second high-voltage switching circuit; and
an additional diode coupled in antiparallel arrangement with the first plurality of diodes.

26. The system of claim 13, comprising:
an ultrasound transducer coupled to the output node.

27. A method, comprising:
in a first mode of operation of an ultrasound system,
conducting a driving current through a first branch of a voltage shifter, the first branch coupling a first high-voltage switching circuit of the voltage shifter to a second high-voltage switching circuit of the voltage shifter;
conducting a biasing current through a second branch of the voltage shifter, separate from the first branch of the voltage shifter, the second branch coupling the first high-voltage switching circuit of the voltage shifter to the second high-voltage switching circuit of the voltage shifter; and
conducting a sum of the bias current and the driving current through an ultrasound transducer; and
in a second mode of operation of the ultrasound system, conducting the driving current through the first branch of the voltage shifter and the ultrasound transducer.

28. The method of claim 27, comprising:
in a third mode of operation of the ultrasound system,
conducting the bias current through a clamp and a portion of the first branch of the voltage shifter;
conducting the driving current through another portion of the first branch of the voltage shifter; and
conducting the sum of the bias current and the driving current through the ultrasound transducer.

29. The method of claim 28, comprising:
in a fourth mode of operation of the ultrasound system, conducting the driving current through the ultrasound transducer and the clamp.

30. The method of claim 27 comprising regulating a voltage in the first branch of the voltage shifter.

31. The device of claim 12, comprising a clamp node coupled to the second high-voltage switching circuit, wherein the first branch and the second branch are coupled between the first high-voltage switching circuit and the clamp node.

32. The device of claim 12, comprising:
a first reference-voltage node, wherein the first high-voltage switching circuit is coupled between the first reference-voltage node and the first and second branches, and in operation, the first high-voltage switching circuit selectively couples the first reference-voltage node to the first and second branches; and
a second reference-voltage node, wherein the second high-voltage switching circuit is coupled between the second reference-voltage node and the first and second branches, and in operation, the second high-voltage switching circuit selectively couples the second reference-voltage node to the first and second branches.

33. The system of claim 25, comprising:
a first input driver coupled to a control terminal of the first high-voltage switching circuit; and
a second input driver coupled to a control terminal of the second high-voltage switching circuit.

34. The system of claim 33, comprising a controller, which, in operation, generates control signals to control the input drivers.

* * * * *